United States Patent
Kataoka

(10) Patent No.: US 7,498,669 B2
(45) Date of Patent: Mar. 3, 2009

(54) SEMICONDUCTOR DEVICE

(75) Inventor: Shigekazu Kataoka, Aichi-gun (JP)

(73) Assignee: Denso Corporation, Kariya (JP)

( * ) Notice: Subject to any disclaimer, the term of this patent is extended or adjusted under 35 U.S.C. 154(b) by 280 days.

(21) Appl. No.: 11/488,072

(22) Filed: Jul. 18, 2006

(65) Prior Publication Data
US 2007/0029651 A1    Feb. 8, 2007

(30) Foreign Application Priority Data
Aug. 4, 2005    (JP)    ............... 2005-226065

(51) Int. Cl.
H01L 23/48    (2006.01)
(52) U.S. Cl. ............... 257/688; 257/689; 257/690; 257/734; 257/E23.004; 257/E23.181; 257/E23.188; 257/E23.189
(58) Field of Classification Search ............... 257/666, 257/678–734, E23.001–E23.194
See application file for complete search history.

(56) References Cited

U.S. PATENT DOCUMENTS 3,268,309 A * 8/1966 Frank et al. ............... 428/620
4,514,587 A * 4/1985 Van Dyk Soerewyn ..... 174/551
6,559,529 B2 * 5/2003 Torti et al. ............... 257/684
7,126,213 B2 * 10/2006 Huang ............... 257/684

FOREIGN PATENT DOCUMENTS

| JP | 61-156847 | * | 7/1986 | ............... 257/E23.186 |
| JP | 62-69543 | * | 3/1987 | ............... 257/E23.186 |
| JP | A 2002-119029 | | 4/2002 | |

* cited by examiner

*Primary Examiner*—Jasmine J Clark
(74) *Attorney, Agent, or Firm*—Oliff & Berridge, PLC

(57) ABSTRACT

A rectify element as a semiconductor device has a disk section, a first solder part, a buffer plate, a second solder part, a semiconductor chip, and a lead, and a sealing member with which the semiconductor chip is sealed. A cylindrical concave part is formed at one end surface of the disk section. A side wall of the cylindrical concave part faced to an inner peripheral wall at the upper surface of the disk section has a sloped shape of an angle of more than 90° to a contact surface of the upper surface of the disk section on which the semiconductor chip is placed.

10 Claims, 4 Drawing Sheets

SEMICONDUCTOR DEVICE

CROSS-REFERENCE TO RELATED APPLICATION

This application is related to and claims priority from Japanese Patent Application No. 2005-226065 filed on Aug. 4, 2005, the contents of which are hereby incorporated by reference.

BACKGROUND OF THE INVENTION

1. Field of the Invention

The present invention generally relates to a semiconductor device as a rectify element incorporated in a rectify device to be applied to a vehicle alternator mounted on a vehicle such as a passenger car and a truck.

2. Description of the Related Art

A vehicle alternator is driven by the engine power generated by and transmitted from an internal combustion engine mounted on a vehicle in order to generate electric power. The vehicle alternator supplies the generated electric power to a battery, and the battery charges the electric power therein. The vehicle alternator also supplies the generated electric power to various kinds of electric devices and loads mounted on the vehicle such as an igniter for the internal combustion engine, a lighting system and auxiliaries.

In order to maintain and further strengthen the competitive power in the international market, it is necessary to achieve downsizing of a vehicle alternator and drastic cost-down of the manufacturing cost, and to increase or enhance the magnitude of its output power and reliability. Those are the important problems to be solved at present in such a technical field. For example, in order to increase the reliability and lifetime of a rectify element as a semiconductor device, the press-in mechanism and its manner has been known. The semiconductor device as the rectify element on which a semiconductor chip is fabricated is press-in into a hole section formed in a radiating fin of the rectify device in order to adequately and efficiently radiate the heat generated in the semiconductor chip because a large amount of current flows therein. The Japanese laid open publication (No. JP 2002-119029) has disclosed such a conventional semiconductor device as the rectify element incorporating a semiconductor chip. Such a semiconductor device has a disk section in which a concave part is formed. The semiconductor chip is placed on and fixed to the bottom of the concave part with solder. The outside peripheral wall of the disk section in the semiconductor device has a cylindrical or tubular shape and the side wall of the concave part that is faced to the inside peripheral wall of the disk section also has a cylindrical shape. The side wall of the concave part is perpendicular to the bottom surface of the disk section of the semiconductor device. After the completion of the solder process of the semiconductor chip, the semiconductor chip is sealed with a silicon rubber or resin as a sealing member in the concave part.

In general, a vehicle alternator is equipped with such a rectify device disclosed in the above patent document, and the armature shaft of the vehicle alternator is mounted on the vehicle in parallel to the surface of the ground. Such a case, because the bottom surface of the disk section of the semiconductor device is disposed perpendicular to the surface of the ground, the side wall of the concave part in the disk section is perpendicular to the bottom surface or the inside upper surface of the disk section. That means that the inside wall of the concave part is placed in parallel to the surface of the ground. Accordingly, if the sealing member is separated from the concave part in the disk section by erosion of moisture, water, or salt water, and the water or moisture is then accumulated in the concave part, the water or moisture ingress occurs. The water or moisture accumulated in the concave part, and then reaches to the semiconductor chip formed in the concave part and formed on the disk section. Thus, the semiconductor device involves various drawbacks, for example, the semiconductor chip falls in short circuit by water, moisture, or salt water ingress, and its reliability deteriorates and its lifetime is further decreased, or the semiconductor device thereby falls in failure.

SUMMARY OF THE INVENTION

It is an object of the present invention to provide a semiconductor device such as a rectify element having an improved water proof capability in preventing moisture, water, or salt water ingress into a semiconductor chip fabricated in the semiconductor device in order to obtain the high reliability and long lifetime.

To achieve the above purpose, the present invention provides a semiconductor device consisting of a disk section and a semiconductor chip. A concave part of a tapered shape is formed in the disk section. The tapered side wall of the concave part has the angle of more than 90° to a bottom surface of the concave part. The semiconductor chip is soldered on the bottom surface of the concave part. In particular, it is preferred to use the semiconductor device of the present invention applied to various application devices under the circumstance in which the bottom surface of the concave part is so set perpendicular to the ground.

Further, according to the present invention, the side wall of the concave part has the tapered shape, in other words, because the inside peripheral wall of the disk section that is faced to the side wall of the concave part has the tapered shape, not perpendicular to the bottom surface of the concave part, it is possible to rapidly drain or discharge water or salt water entered into the concave part, and to prevent occurrence of short-circuit in the semiconductor chip, and thereby possible to increase the reliability and lifetime of the semiconductor device.

Still further, according to the present invention, it is preferred to fill the concave part formed in the disk section with a sealing member, with which the semiconductor chip is completely sealed. It is thereby possible to prevent moisture, water, or salt water ingress into the inside of the semiconductor chip. Furthermore, even if the sealing member is separated from the tapered side wall of the concave part, namely from the tapered inside peripheral surface of the disk section, the water ingress into the space between the sealing member and the semiconductor chip can be drained smoothly along the tapered side wall of the concave part to the outside. Therefore it is possible to prevent any moisture, water, or salt water ingress into the semiconductor chip.

Furthermore, according to the present invention, it is preferred to form a circular groove or a circular convex part at the bottom surface of the concave part, namely the inside upper surface of the disk section around the outer peripheral section of the semiconductor chip. It is thereby difficult to enter moisture, water, or salt water ingress into the semiconductor chip through the side wall of the concave part. As a result, it is possible to further prevent any moisture, water, or salt water ingress into the semiconductor chip.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
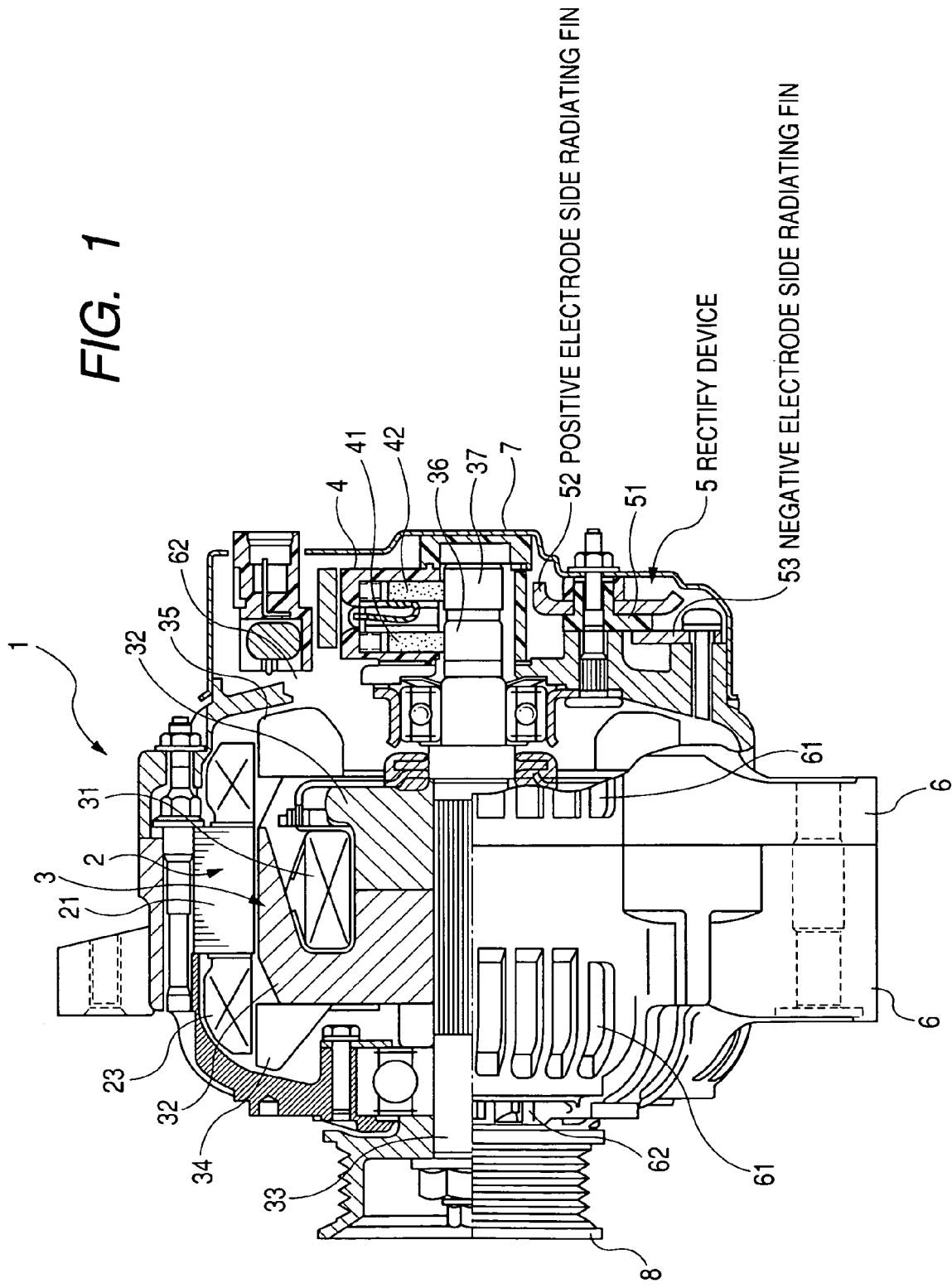
FIG. 1 is a sectional view showing an entire configuration of a vehicle alternator equipped with a rectify device to be mounted on a vehicle according to the first embodiment of the present invention.

Hereinafter, various embodiments of the present invention will be described with reference to the accompanying drawings. In the following description of the various embodiments, like reference characters or numerals designate like or equivalent component parts throughout the several diagrams.

Embodiment

A description will be given of a configuration of a semiconductor device as a rectify element according to an embodiment of the present invention to be applied to a vehicle alternator with reference to FIG. 1 to FIG. 5.

FIG. 1 is a sectional view showing the entire configuration of the vehicle alternator equipped with the rectify device to be mounted on a vehicle according to the embodiment of the present invention.

As shown in FIG. 1, the vehicle alternator 1 has a stator 2, a rotor 3, a brush device 4, a rectify device 5, a frame 6 made of several parts, a pulley 8, and the like.

The stator 2 consists of a stator core 21 and three phase stator windings 23 wound on a plurality of slots that are formed in the stator core 21 at a specified interval to each other.

The rotor 3 has an insulating bobbin, a cylindrical field coil, and a pair of pole cores 32. The cylindrical field coil is made of copper wire treated with electric insulation wound around the insulating bobbin in a concentric configuration. Each of the pole cores 32 has six claw poles. That is, the cylindrical field coil 31 is accommodated in a pair of the pole cores 32 faced to each other through the rotary shaft 33 of the rotor 3. The cylindrical field coil 31 is disposed inside the inner peripheries of the claw poles of a pair of the pole cores 32. At one end surface of the pole core 32 at the front end, an axial flow cooling fan 34 is soldered in order to discharge cooling air introduced from the front section to the axial and radial directions of the rotor 3. Likewise, at one end surface of the pole core 32 at the rear end, a centrifugal flow cooling fan 35 is soldered in order to discharge cooling air introduced from the rear section to the radial direction of the rotor 3

The brush device 4 has brushes 41 and 42 corresponding to respective slip rings 36 and 37 formed on the rotary shaft 33 of the rotor 3 so that exciting current flows from the rectify device 5 to the cylindrical field coil 31.

The rectify device 5 rectifies a three phase alternating (A.C.) voltage as output voltage of the three phase winding 32 to a direct current (D.C.) output voltage. The rectify device 5 consists of a terminal board having wiring electrodes therein, a positive electrode side radiating fin 52 and two negative electrode side radiating fins 53, and several semiconductor devices such as plural rectify elements 54 and 55 (described below) that are set into the radiating fins 52 and 53 by press-in manner, and those rectify elements 54 and 55 are disposed at a specified interval in the rectify device 5.

The frame 6 accommodates the stator 2 and the rotor 3 therein. The rotor 3 is fixed to the rotary shaft 33 in order to rotate around the rotary shaft 33. The stator 2 is fixed to the frame 6 and disposed at a specified interval around the outer peripheral side of the pole core 32 of the rotor 3.

The frame 6 has a cooling air outlet 61 and a cooling air inlet 62. The cooling air outlet 61 is formed at the area faced to the stator coil 23 protruded from the end surface of the stator core 21 in its axis direction. The cooling air inlet 62 is formed at the end surface of the frame 6 in its axis direction.

The rear cover 7 accommodates the entire of the rectify device 5, the brush device 4 attached to the outside of the frame 6, and an IC regulator in order to protect them from various damages.

In the vehicle alternator 1 having the above configuration, the rotation power is transmitted from the internal combustion engine (omitted from drawings) to a pulley 8 through a belt (omitted from drawings), and the rotor 3 receives the rotation power through the pulley 8 and then rotates in a specified direction. In this state, when an exciting voltage is applied to the field coil 31 of the rotor 3, the respective claw poles of the pole cores 32 are excited, and the three phase A.C. voltage is thereby generated in the stator coil 23. The rectify device 5 rectifies the A.C voltage to the D.C output voltage. The D.C. output voltage is supplied to the outside through the output terminals of the rectify device 5.

Next, a description will now be given of the rectify device 5 in detail with reference to FIG. 2.

Figure 2:
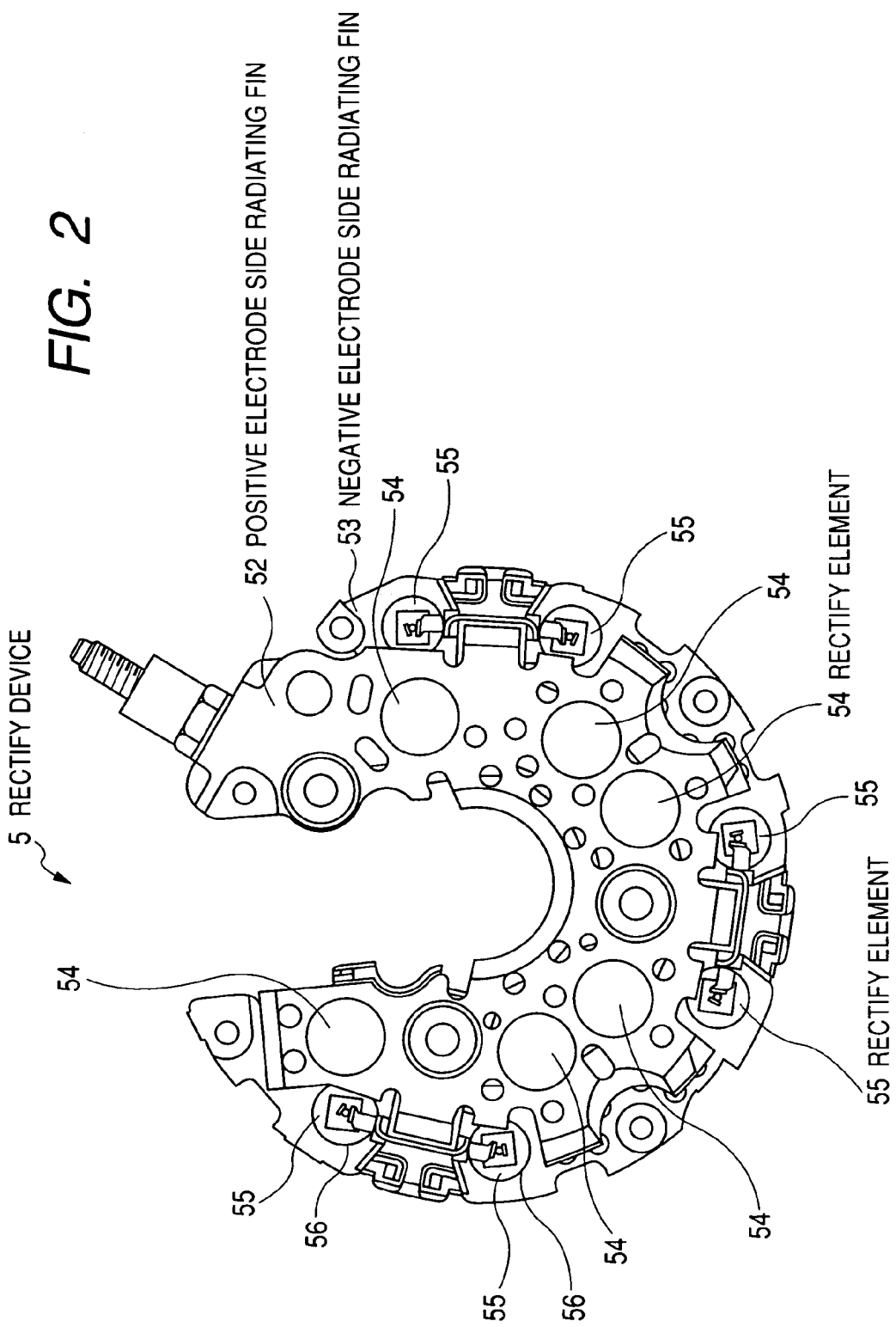
FIG. 2 is a plan view showing a detailed configuration of the rectify device shown in FIG. 1, in which a plurality of the semiconductor devices as rectify elements are set to holes formed in radiating fins by press-in process.

FIG. 2 is a plan view showing a detailed configuration of the rectify device 5, in which a plurality of the semiconductor devices 54 and 55 (as rectify elements) are set by press-in manner in radiating fins 52 and 53 so that they are disposed at a specified interval.

The following description will explain mainly the rectify elements 55 placed at the negative electrode side in the rectify device 5, which are set by press-in manner in the negative electrode side radiating fins 53. Because the rectify elements 54 that are disposed at the positive electrode side has the same configuration of the rectify elements 55 disposed at the negative electrode side, the explanation for the rectify elements 54 is omitted here.

The rectify device 5 is made of the single positive electrode side radiating fin 52 and the two negative electrode side radiating fins 53. Three press-in holes 56 are formed in each positive electrode side radiating fin 53. The negative electrode rectify elements 55 are set by pres-in manner into the pres-in holes 56. Using the press-in manner can reduce the working steps and the manufacturing cost when compared with the use of solder.

Figure 3:
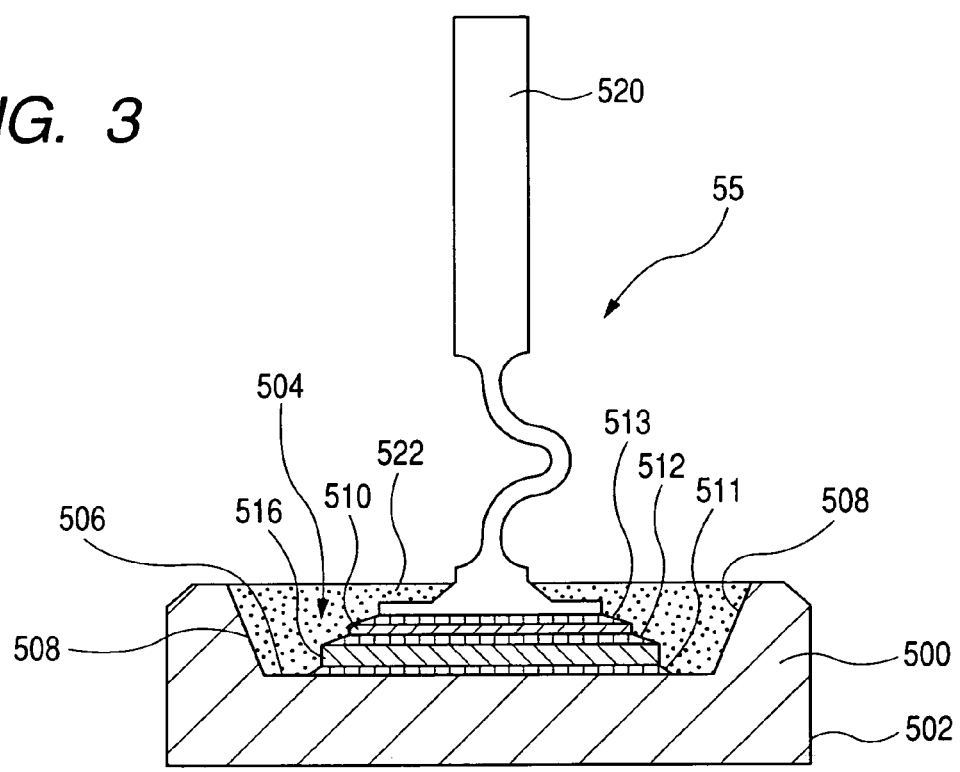
FIG. 3 is a sectional view showing the semiconductor device (as a rectify element), consisting of a semiconductor chip, a concave part, and a disk section on which the semiconductor chip is placed.

FIG. 3 is a sectional view showing the configuration of the rectify element 55 of the negative electrode side, which consists of a semiconductor chip 510, a disk section 500, a buffer plate 516, and a lead 520. The outer peripheral surface of the disk section 500 has a knurl part 502. That is, the outer peripheral surface of the disk section 500 is knurled to prevent a slippage. The disk section 500 has a cylindrical shape. A concave part 504 is formed in the upper surface area of the disk section 500. As shown in FIG. 3, the bottom surface 506 of the concave section 504, namely, the inside upper surface 506 of the disk section 500 acts as the contact surface 506 on which the semiconductor chip 510 is soldered. As shown in FIG. 3, the bottom surface 506 of the concave section 504 indicates the same area, namely, the inside upper surface 506 of the disk section 500.

The side wall 508 of the concave part 504 that also indicates the inside peripheral wall 508 of the disk section 500 has a tapered shape (or a corn part) of angle of more than 90° to the contact surface 506. That is, the tapered inside peripheral wall 508 of the disk section 500 is inclined to the contact surface 506.

As shown in FIG. 3, the buffer plate 516 is soldered with solder 511 on the contact surface 506 of the disk plate 500 in the rectify element 55 for the negative electrode side. The lead 520 is soldered with solder 513 on the semiconductor chip 510. The entire of the semiconductor chip 510 is covered with a sealing member 522 such as silicon rubber or resin.

When the semiconductor device as the rectify element 55 of the present invention is applied to the rectify device 5 mounted on the vehicle alternator 1 having the configuration shown in FIG. 1, the rotary shaft 33 of the rotor 3 is placed approximately in parallel to the ground.

In general, because the rectify device 5 is so mounted on the vehicle alternator 1 that each of the positive electrode side radiating fin 52 and the two negative electrode side radiating fins 53 forming the rectify device 5 is placed or disposed perpendicular to the rotary shaft 33, the contact surface 506 of the disk section 500 in the rectify element 55 (namely, which equal to the inside upper surface 506 of the disk section 500) of each negative electrode side radiating fin 53 is placed perpendicular to the ground.

Therefore the disk section 500 of the rectify element 55 placed in each negative electrode side radiating fin 53 (also, similar to the case of the positive electrode side radiating fin 53) has the concave section 504 in which the semiconductor chip 510 and the buffer plate 506 are mounted by solder, and in particular, the side wall 508 of the concave section 504, namely, the inside peripheral wall 508 of the disk section 500 has a tapered shape (or a corn shape) of angle of more than 90°. In the daily use of the vehicle (not shown) equipped with the vehicle alternator 1, the contact surface 506 of the disk section 500 as the bottom surface of the concave part 504 is placed perpendicular to the ground. This is also one of the important features of the present invention.

The semiconductor device as the rectify element 5 of the embodiment according to the present invention has the sloped side wall 508 of the concave part 504 (namely, the sloped inner peripheral wall 508 of the disk section 500) having the tapered part, not perpendicular to the ground in arrangement in use. Accordingly, even if moisture, water, or salt water invades into the concave part 504, it is possible to easily drain the entered one to the outside of the semiconductor device. This feature can prevent any occurrence of short-circuit failure in the semiconductor device as the rectify element, and increases the reliability and durability of the rectify elements 54 and 55 for both the negative electrode side and the positive electrode side, and also of the vehicle alternator 1 equipped with those elements 54 and 55.

As another feature of the present invention, the buffer plate 516 is disposed between the semiconductor chip 510 and the contact surface 506 of the disk section 500. Because the buffer plate 516 is capable of absorbing and reducing impact stress, the configuration of the rectify element 54 or 55 can reduce the impact stress applied to the semiconductor device 55 through the contact surface 506. This configuration further enhances the reliability and durability of the semiconductor device such as the negative electrode rectify elements 55 and the positive electrode rectify elements 54, and also increases the reliability and durability of the rectify device 5 and the vehicle alternator 1 equipped with those elements 54 and 55.

The semiconductor device according to the present invention has the sealing member 522 with which the concave part 504 is filled. The sealing member 522 is capable of protecting the entire of the semiconductor chip 510. Further, the sealing member 522 can prevent any occurrence of moisture, water, or salt water ingress into the semiconductor chip 510 because the sealing member 522 is adhered closely to the contact surface 506 of the disk section 500 and the sloped side wall 508 of the concave section 504 (or the inside peripheral wall of the disk section 500). Further, even if water, or salt water enters into the semiconductor device 54 or 55 (as the rectify element) when the sealing member 522 is separated from the sloped side wall 508 and the contact surface 506, the sloped side wall 508 can drain the water to the outside through the tapered area of the side wall 508, it is possible to prevent any invasion to the semiconductor chip 510.

The present invention is not limited by the configuration of the semiconductor device shown in FIG. 3, it is possible to provide various modifications within the concept thereof. For example, in the above configuration shown in FIG. 3, because the contact surface 506, namely, the inside upper surface 506 of the disk section 500 is a flat shape, it is acceptable to form a groove in or a convex part on the contact surface 506 of the disk section 500, which is formed in the outside area of the semiconductor chip 510 soldered on the contact surface 506 of the disk section 500.

Figure 4:
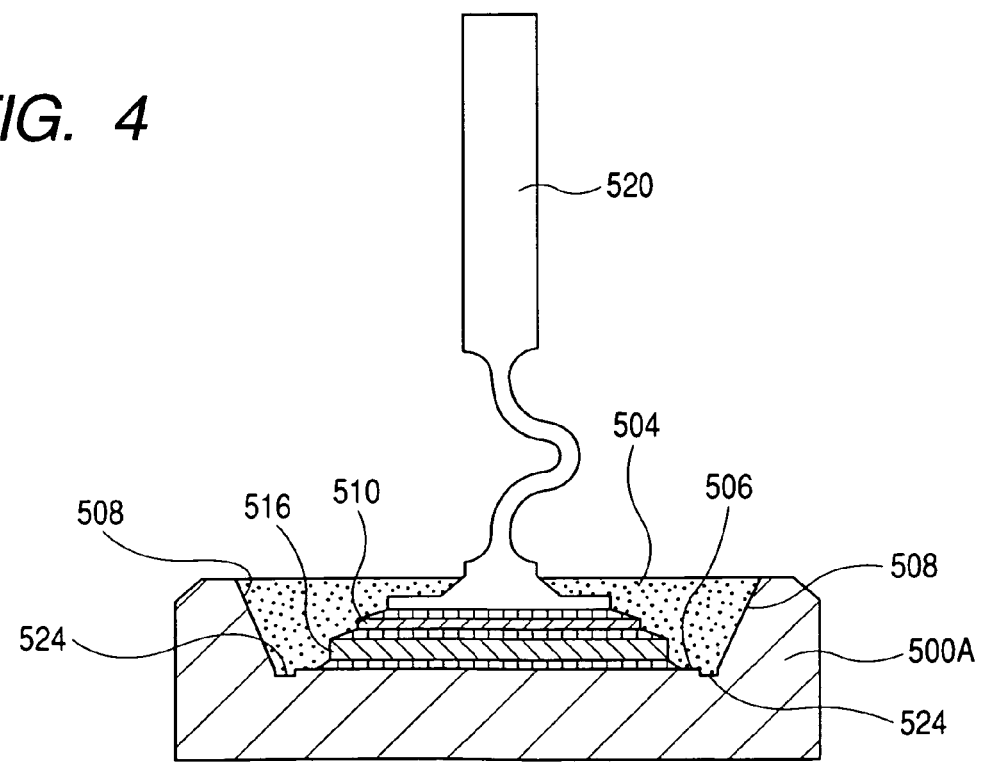
FIG. 4 is a sectional view showing a semiconductor device (as a rectify element), consisting of a semiconductor chip, a concave part, and a disk section, and a circular groove is formed in the inside upper surface of the disk section faced to the bottom of the concave part around the semiconductor chip according to another configuration of the embodiment of the present invention.

FIG. 4 is a sectional view showing the semiconductor device that consists of a disk section 500A and the semiconductor chip 510 placed in the concave part 504 of the disk section 500A, in which a circular groove 524 is formed on the contact surface 506 (or the bottom surface) of the disk section 500A according to another configuration of the embodiment of the present invention.

As shown in FIG. 4, the circular groove 524 is formed in the contact surface 506 of the disk section 500A and around the outer peripheral of the buffer plate 516 and the semiconductor chip 510. Other components of the semiconductor device shown in FIG. 4 are the same of those shown in FIG. 3. Therefore the explanation for the same components is omitted here.

Figure 5:
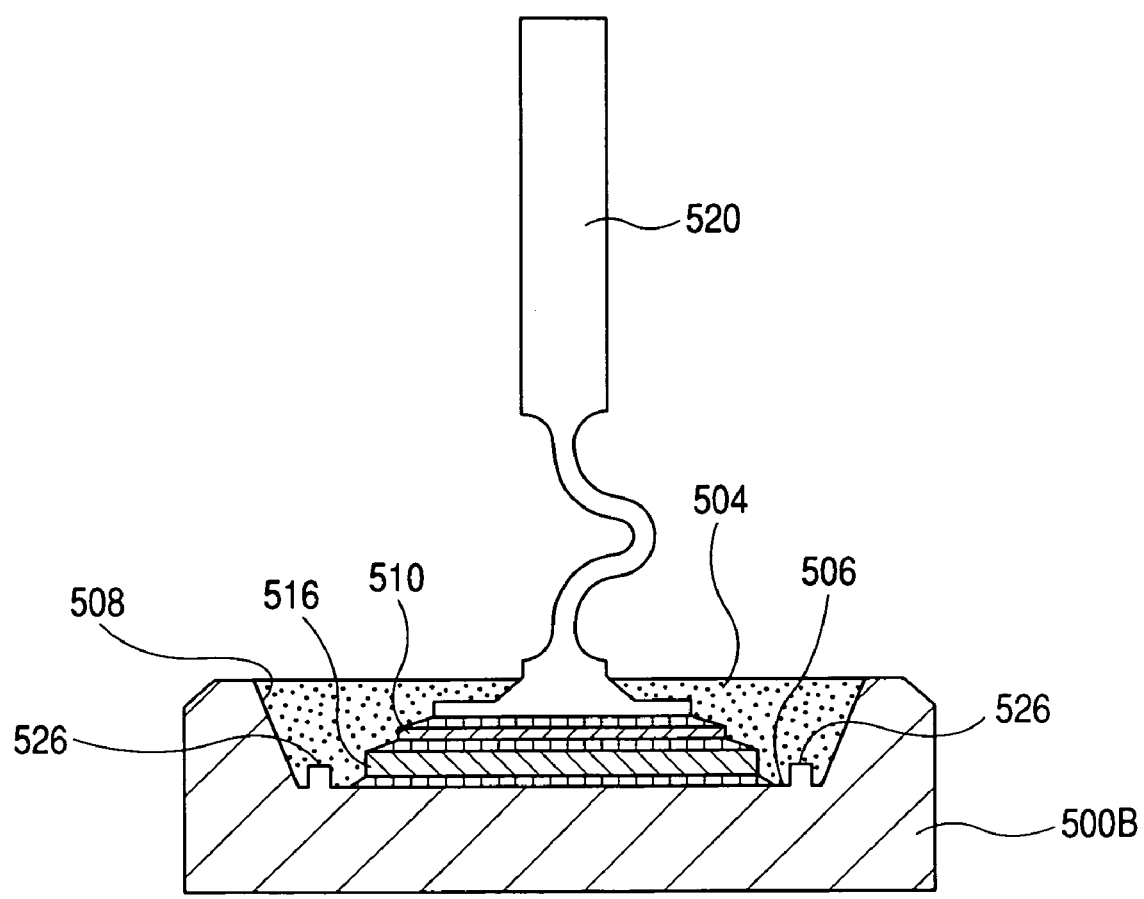
FIG. 5 is a sectional view showing a semiconductor device (as a rectify element), consisting of a semiconductor chip, a concave part, and a disk section, and a circular convex part is formed on the inside upper surface of the disk section faced to the bottom of the concave part around the semiconductor chip according to another configuration of the embodiment of the present invention.

FIG. 5 is a sectional view of the semiconductor device that consists of a disk section 500B and the semiconductor chip 510 placed on the contact surface 506 in the concave part 504 of the disk section 500B, in which a circular convex part 526 is formed on the contact surface 506 (or the bottom surface) of the disk section 500B according to another configuration of the embodiment of the present invention.

As shown in FIG. 5, the circular convex part 526 is formed on the contact surface 506 of the disk section 500B and around the around the outer peripheral of the buffer plate 516 and the semiconductor chip 510. Other components of the semiconductor device shown in FIG. 5 are the same of those shown in FIG. 3. Therefore the explanation for the same components is omitted here.

Because the circular groove 524 shown in FIG. 4 is formed in or the circular convex part 526 is formed on the contact surface 506 of the disk section 500 of the semiconductor device, it is possible to prevent occurrence of moisture, water, or salt water ingress into the semiconductor chip 510 through the sloped side wall 508 of the disk section 500A or 500B. Further, because the contact surface 508 has a complicated configuration by the presence of the circular groove 524 or the circular convex part 526, it is possible to increase the adhesion force of the sealing member 522 to the contact surface 506 of the disk section.

Because each of the rectify elements 54 and 55 is set by press-in manner to the through hole formed in the corresponding discharging fin 52 or 53 of the rectify device 5, it is possible to form a concave part on the discharging fins 52 and 53 instead of the through holes, and the each rectify element is set by press-in manner to the concave part.

Still further, the present invention is not limited by the embodiment described above in which the semiconductor device is applied to the rectify device for the vehicle alternator mounted on a vehicle. It is also possible to adopt the concept of the present invention to various types of semiconductor devices including the rectify element to be applied to other applications.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A semiconductor device comprising:
   a disk section having a concave part, and a side wall of an inside of the concave part having a tapered shape of angle of more than 90° to a bottom surface of the concave part; and
   a semiconductor chip soldered on the bottom surface of the concave part through a buffer plate that absorbs and reduces impact stress generated between the semiconductor chip and an inside upper surface of the disk section which serves as the bottom surface, wherein
   widths of each of the bottom surface, the buffer plate and the semiconductor chip, laminated in that order, grow consecutively narrower from the bottom surface to the semiconductor chip.

2. The semiconductor device according to claim 1, wherein the semiconductor device is so disposed in an application device, to which the semiconductor device is applied, that the bottom surface of the concave part of the disk section is perpendicular to a ground.

3. The semiconductor device according to claim 1, further comprising a sealing member with which the semiconductor chip is sealed in the concave part.

4. The semiconductor device according to claim 2, further comprising a sealing member with which the semiconductor chip is sealed in the concave part.

5. The semiconductor device according to claim 1, wherein a circular groove is formed in an inside upper surface of the disk section faced to the bottom surface of the concave part and around an outer peripheral area of the semiconductor chip.

6. The semiconductor device according to claim 2, wherein a circular groove is formed in an inside upper surface of the disk section faced to the bottom surface of the concave part and around an outer peripheral area of the semiconductor chip.

7. The semiconductor device according to claim 3, wherein a circular groove is formed in an inside upper surface of the disk section faced to the bottom surface of the concave part and around an outer peripheral area of the semiconductor chip.

8. The semiconductor device according to claim 1, wherein a convex part is formed on an inside upper surface of the disk section faced to the bottom surface of the concave part and around an outer peripheral area of the semiconductor chip.

9. The semiconductor device according to claim 2, wherein a convex part is formed on an inside upper surface of the disk section faced to the bottom surface of the concave part and around an outer peripheral area of the semiconductor chip.

10. The semiconductor device according to claim 3, wherein a convex part is formed on an inside upper surface of the disk section faced to the bottom surface of the concave part and around an outer peripheral area of the semiconductor chip.

* * * * *